United States Patent
Krupadanam et al.

(10) Patent No.: US 8,883,333 B2
(45) Date of Patent: Nov. 11, 2014

(54) FLOW AND SOC DETERMINATION USING PUMP MEASUREMENTS

(71) Applicant: Robert Bosch GmbH, Stuttgart (DE)

(72) Inventors: Ashish Samuel Krupadanam, Cupertino, CA (US); Maksim Subbotin, Menlo Park, CA (US); Nalin Chaturvedi, Sunnyvale, CA (US); Jasim Ahmed, Mountian View, CA (US)

(73) Assignee: Robert Bosch GmbH, Stuttgart (DE)

( * ) Notice: Subject to any disclaimer, the term of this patent is extended or adjusted under 35 U.S.C. 154(b) by 43 days.

(21) Appl. No.: 13/709,372

(22) Filed: Dec. 10, 2012

(65) Prior Publication Data
US 2013/0149573 A1 Jun. 13, 2013

Related U.S. Application Data

(60) Provisional application No. 61/569,246, filed on Dec. 10, 2011.

(51) Int. Cl.
| H01M 2/00 | (2006.01) |
| H01M 8/04 | (2006.01) |
| H01M 8/18 | (2006.01) |
| H01M 2/40 | (2006.01) |
| G01R 31/36 | (2006.01) |

(52) U.S. Cl.
CPC ............ *H01M 2/40* (2013.01); *H01M 8/04761* (2013.01); *H01M 8/04992* (2013.01); *H01M 8/04373* (2013.01); *Y02E 60/12* (2013.01); *H01M 8/04753* (2013.01); *Y02E 60/528* (2013.01); *H01M 8/188* (2013.01); *G01R 31/3606* (2013.01); *H01M 8/04597* (2013.01)
USPC .......................................................... 429/63

(58) Field of Classification Search
CPC ..... Y02E 60/528; Y02E 60/12; Y02E 60/128; H01M 8/188; H01M 8/20; H01M 2/40; H01M 8/04186; H01M 8/04276; H01M 8/04992; H01M 8/04373; H01M 8/04753; H01M 8/04761; H01M 8/04597
USPC .................................. 429/51, 61, 62, 63, 105
See application file for complete search history.

(56) References Cited

U.S. PATENT DOCUMENTS

| 7,687,193 B2 * | 3/2010 | Harper ........................ 429/101 |
| 2005/0158614 A1 * | 7/2005 | Hennessy ...................... 429/61 |
| 2012/0045680 A1 * | 2/2012 | Dong et al. .................. 429/109 |

FOREIGN PATENT DOCUMENTS

| JP | 2006147376 A | 6/2006 |
| WO | 9003666 A1 | 4/1990 |
| WO | 2010138951 A2 | 12/2010 |

OTHER PUBLICATIONS

International Search Report in corresponding PCT Application (i.e., PCT/US2012/068709) mailed Apr. 4, 2013 (10 pages).

(Continued)

*Primary Examiner* — Stewart Fraser
(74) *Attorney, Agent, or Firm* — Maginot Moore & Beck LLP

(57) ABSTRACT

In one embodiment, a flow battery system includes a reactor, a first pump operably connected to a first electrolyte tank and to the reactor, a second pump operably connected to a second electrolyte tank and to the reactor, a memory including program instructions stored therein, and a controller operably connected to the first pump, the second pump, and the memory and configured to execute the program instructions to determine a first flow rate through the first pump based upon first pump operating parameters including a differential pressure across the first pump, control the first pump based upon the first flow rate, determine a second flow rate through the second pump based upon second pump operating parameters including a differential pressure across the second pump, control the second pump based upon the second flow rate.

20 Claims, 3 Drawing Sheets

(56) References Cited

OTHER PUBLICATIONS

Blanc et al, "Understanding the Vanadium Redox Flow Batteries", Paths to Sustainable Energy, InTech, Dec. 2010, pp. 333-358, Switzerland (26 pages).

Shah et al, "A dynamic Unit Cell Model for the All-Vanadium Flow Battery", Journal of the Electrochemical Society, 2011, pp. A671-A677, vol. 158, No. 6, Electrochemical Society, United Kingdom (7 pages).

You et al, "A simple model for the vanadium redox battery", Electrochimica Acta, 2009, pp. 6827-6836, vol. 54, Elsevier, Peoples Republic of China (10 pages).

\* cited by examiner

US 8,883,333 B2

FLOW AND SOC DETERMINATION USING PUMP MEASUREMENTS

This application claims the benefit of U.S. Provisional Application No. 61/569,246 filed Dec. 10, 2011, the entire contents of which are herein incorporated by reference.

FIELD

This invention relates to flow batteries.

BACKGROUND

A flow battery is a form of rechargeable battery in which electrolyte containing one or more dissolved electroactive species flows through an electrochemical cell that converts chemical energy directly to electricity. The electrolyte is stored externally, generally in tanks, and is pumped through the cell (or cells) of the reactor. Control of flow batteries requires knowledge of the flow rate and State of Charge (SOC). Together they determine the concentration and availability of reactants at the electrodes and the current that can be drawn from the cell for the best efficiency and within safe limits. The SOC is also used to determine how much energy the battery can store or deliver. This can be used to plan the usage of the battery in a device or within a power supply system. It may also determine the power that the battery can produce.

Using flow sensors is problematic since flow sensors are often expensive, inaccurate, and/or have a short life within the flow battery environment. Obtaining SOC frequently requires additional sensors and monitoring equipment. Increased amount of sensors and equipment increases the cost of the system.

A need exists for a flow battery system which can provide flow determination without the need for using a dedicated flow sensor. A further need exists for a flow battery system which can easily provide SOC determination without the need for additional equipment.

SUMMARY

In one embodiment, a flow battery system includes a reactor, a first pump operably connected to a first electrolyte tank and to the reactor, a second pump operably connected to a second electrolyte tank and to the reactor, a memory including program instructions stored therein, and a controller operably connected to the first pump, the second pump, and the memory and configured to execute the program instructions to determine a first flow rate through the first pump based upon first pump operating parameters including a differential pressure across the first pump, control the first pump based upon the first flow rate, determine a second flow rate through the second pump based upon second pump operating parameters including a differential pressure across the second pump, control the second pump based upon the second flow rate.

In another embodiment, a flow battery system includes a reactor, at least one pump operably connected to at least one electrolyte tank and to the reactor, a memory including program instructions stored therein, and a controller operably connected to the first pump, and the memory and configured to execute the program instructions to obtain first signals associated with operating parameters of the at least one pump, associate the first signals with a first flow rate through the at least one pump, and control the at least one pump based upon the associated first flow rate.

DESCRIPTION

Figure 1:
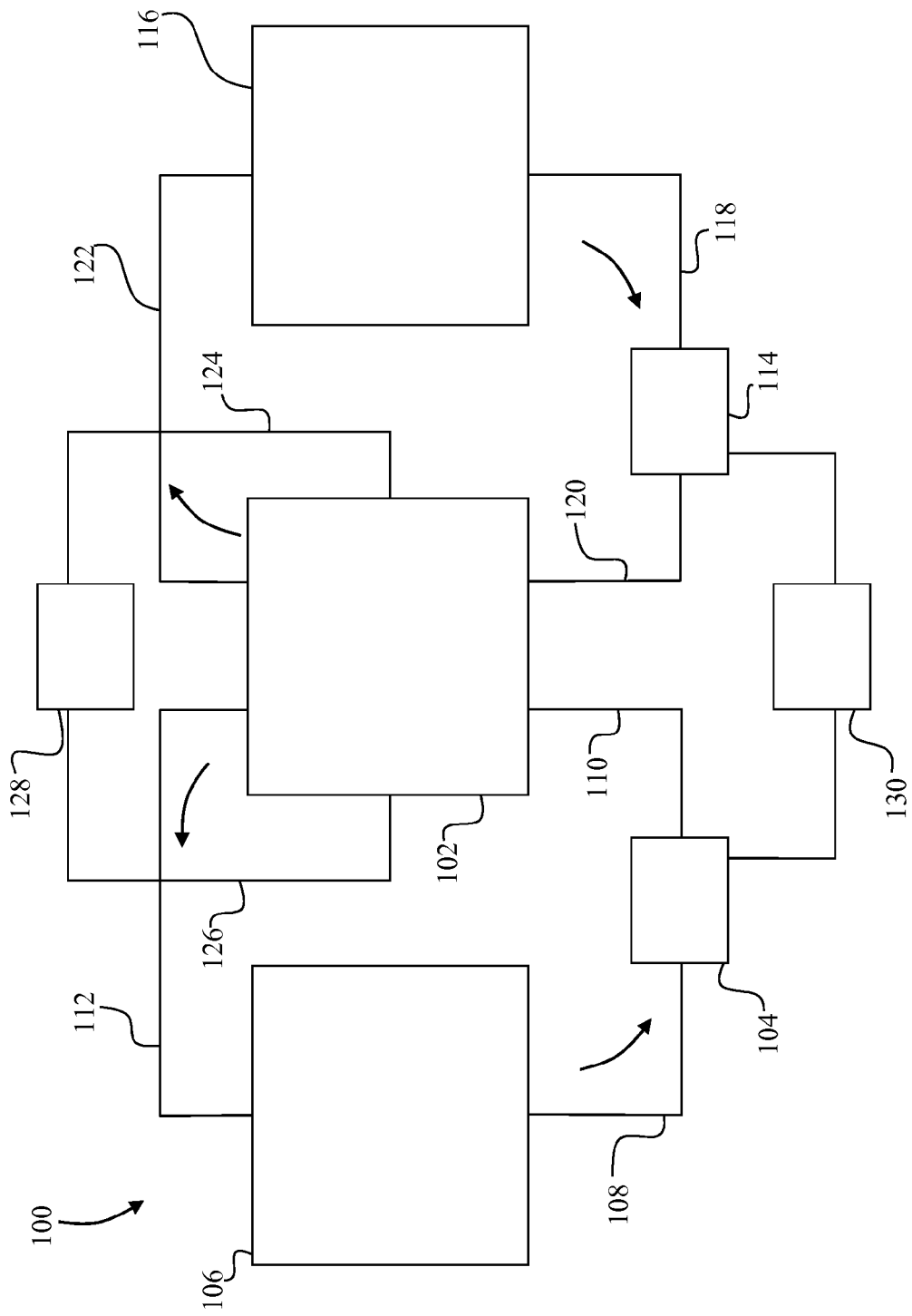
FIG. 1 depicts a schematic of a flow battery system in accordance with principles of the present invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a flow battery system 100 which includes a reactor 102. A pump 104 takes suction from an electrolyte tank 106 though a supply line 108. The pump 104 provides a first electrolyte to the reactor 102 through a feed line 110. The first electrolyte is returned to the electrolyte tank 106 from the reactor 102 through a first return line 112.

A pump 114 takes suction from a second electrolyte tank 116 though a supply line 118. The pump 114 provides a second electrolyte to the reactor 102 through a feed line 120. The second electrolyte is returned to the electrolyte tank 116 from the reactor 102 through a first return line 122.

Within the reactor 102, the first electrolyte and the second electrolyte chemically react through a membrane similar to a hydrogen fuel cell or an electrolyser generating a positive charge at a first electrode 124 and a negative charge at a second electrode 126. The electrodes 124 and 126 may be connected to a load 128 to power the load 128.

Figure 2:
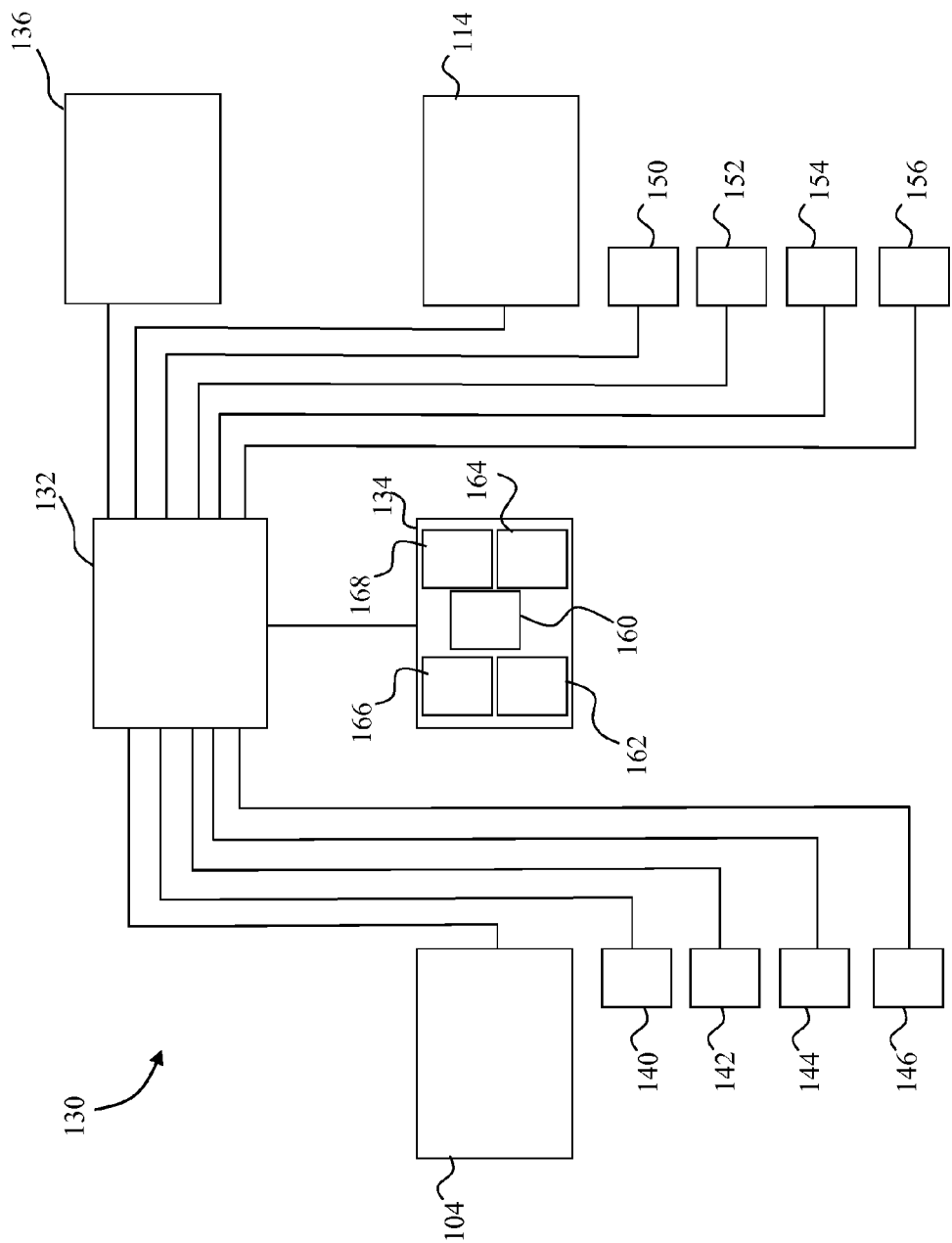
FIG. 2 depicts a schematic view of the control system of FIG. 1.

Operation of the feed pumps 104 and 114, and thus the generation of charge on the electrodes 124 and 126, is controlled by a control system 130 shown in further detail in FIG. 2. The control system 130 includes a processor 132, a memory 134, and a user interface 136. The processor 132 is operably connected to the pump 104 and the pump 114 for controlling operation of the pumps 104 and 114. The processor 132 is further operably connected to various sensors which provide signals indicative of the operating parameters of the pumps 104 and 114.

The sensors which provide signals indicative of operating parameters of the pump 104 include a temperature sensor 140, a differential pressure sensor 142, a current sensor 144, and a speed sensor 146. The temperature sensor 140 provides a signal indicative of the temperature (T) of the motor associated with the pump 104. The differential pressure sensor 142 provides a signal indicative of the change in pressure between the suction of the pump 104 from the supply line 108 to the discharge of the pump 104 at the feed line 110. In some embodiments, two pressure sensors are used in place of the differential pressure sensor 142 to provide a signal indicative of the pressure at the suction of the pump 104 and a second signal indicative of the pressure at the discharge of the pump 104.

The current sensor 144 provides a signal indicative of the current which is being used to drive the motor of the pump 104, and the speed sensor 146 provides a signal indicative of the speed at which the motor driving the pump 104 is rotating.

In like manner, sensors which provide signals indicative of operating parameters of the pump 114 include a temperature sensor 150, a differential pressure sensor 152 (or two pressure sensors), a current sensor 154, and a speed sensor 156 which operate in substantially the same manner as the sensors associated with the pump 104.

The memory 134 includes program instructions 160 which, when executed by the processor 132, allows the flow rates of the electrolytes through the pumps 104 and 114 to be determined based upon the signals received from the sensors 140/142/144/146/150/152/154/156. Flow rate determination is possible based upon known relationships. Specifically, mechanical power of the pumps 104/114 is defined by the following equation:

$$\text{Pump mechanical power} = (p_O - p_I)F$$

wherein: F=Volumetric Flow Rate;
$p_O$=Pressure at outlet of pump; and
$p_I$=Pressure at inlet of pump.

Additionally, for the electrical power driving the pumps, the motor power may be determined according to the following equation:

$$\text{Motor power} = \text{Torque} \times \text{Speed} = K_m IN.$$

wherein: I=Current;
N=Speed; and
$K_m$ is the proportionality constant for the motor.

Given a motor electrical to mechanical efficiency map which is typically supplied by the pump manufacturer or which also be established based upon experiments, and mechanical efficiency map for pump, also supplied by the pump manufacturer or obtained from experiments, the following equation results:

$$\eta_{MP}(I,N,T)IN = (p_O - p_I)F$$

wherein: T=Temperature of motor; and
$\eta_{MP}$ is the combined efficiency map of the motor-pump system and includes the constant of proportionality $K_m$.

Solving the foregoing equation for flow rate results in the following equation ("equation (1)"):

$$F = (\eta_{MP}(I,N,T)IN)/(p_O - p_I)$$

The $\eta_{MP}$ in one embodiment is stored within the memory 134 and the processor 132 in the control system 130 executes the program instructions 160 to solve the foregoing equation thereby determining flow rates of the pumps 104 and 114 without the need of a flow sensor. In some embodiments, the flow determination is filtered for smoothness. Solving equation (1) provides a sensor-less measure of flow and could be filtered for smoothness. As used herein, "sensor-less measure of flow" means a determination of flow rate without using a flow sensor.

Figure 3:
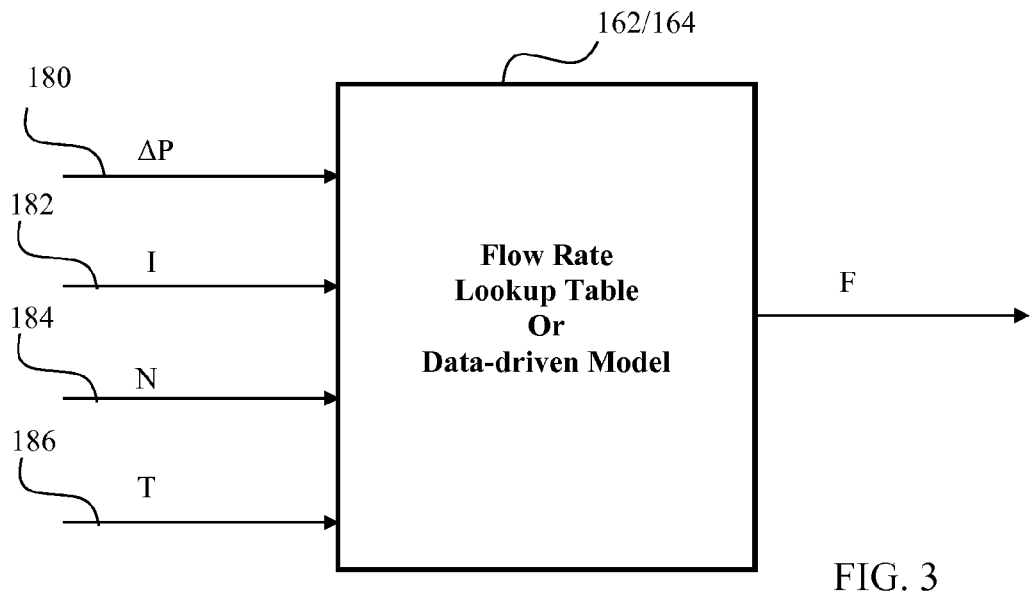
FIG. 3 depicts a schematic of a lookup flow rate table or flow rate model that in one embodiment is incorporated into the control system of FIG. 1 and used to determine flow rate through one or both of the pumps of FIG. 1.
Figure 4:
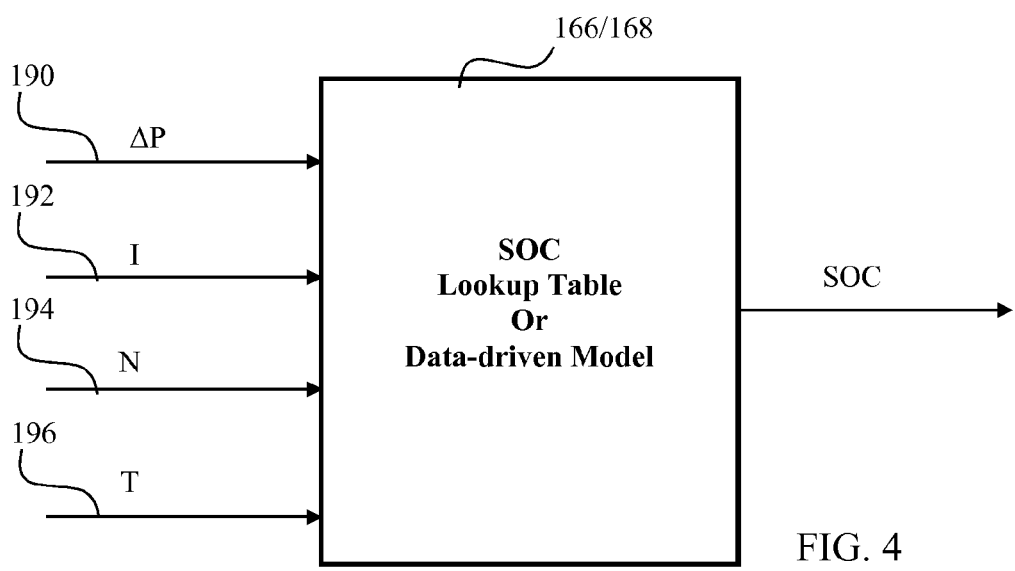
FIG. 4 depicts a schematic of a SOC lookup table or SOC model that in one embodiment is incorporated into the control system of FIG. 1 and used to determine the SOC of the system of FIG. 1.

In one embodiment, the memory 134 within the control system 130 includes a flow rate lookup table 162 and/or a data driven flow rate model 164. The data driven model 164 in some embodiments includes a set of curves fitted to experimental data for each of the pumps 104/114. The flow rate lookup table 162 and/or data driven flow rate model 164 are shown schematically in FIG. 3. Operating parameters which are used in conjunction with the lookup table 162 and/or data driven flow rate model 164 include a differential pressure signal 180 from the relevant differential pressure sensor 142/152, a current signal 182 from the relevant current sensor 144/154, a speed signal 184 from the relevant speed sensor 146/156, and a temperature signal 186 from the relevant temperature sensor 140/150. In some embodiments, one or both of the differential pressure signals 180 for the pumps 104/114 are replaced with inlet and outlet pressure signals from the pumps 104/114.

Accordingly, the processor 132 uses the operating parameters of the pumps 104/114 to determine a sensor-less measure of flow for each of the pumps 104/114. The determined flow rate, along with state of charge (SOC) data and load requirement data are used by the processor 132 to control the pumps 104/114 to provide the desired flow rates for the pumps 104/114.

As noted above, one data used by the processor 132 is the SOC of the flow battery system 100. The SOC in some embodiments is determined by the processor 132. By way of example, in one embodiment, the pumps 104 and 114 are centrifugal pumps. For centrifugal pumps, the head produced is constant for every pump speed. This implies that for every speed, $$(p_O - p_I)/\rho g + V^2/2g = h$$

wherein $\rho$ is density of fluid;
g is acceleration due to gravity;
V is flow speed at pump outlet; and
h is the pump head.

Additionally, the head (h) produced by centrifugal pumps is proportional to the square of pump speed. Therefore, $$2A^2(p_O - p_I)/\rho + F^2 = K_1 N^2 + K_2$$

wherein; A=area of pump outlet cross-section; and
$K_1$, $K_2$ are constants that can be calculated from pump curves provided by manufacturer or calculated from measured data.

Thus, solving for the density of the pumped fluid results in the following equation:

$$\rho = 2A^2(p_O - p_I)/(K_1 N^2 + K_2 - F^2)$$

In flow batteries, the density of the fluid is a function of state of charge, that is, charging or discharging the battery changes the concentration of reactants and products within the battery. If the change in fluid density with SOC is represented by the mapping, $\rho = \rho(SOC)$, then, $$SOC = \rho^{-1}(2A^2(p_O - p_I)/K_1 N^2 + K_2 - F^2))$$

Substituting the equation of paragraph 22 into the equation of paragraph 28 results in the following:

$$SOC = \rho^{-1}(2A^2(p_O - p_I)/(K_1 N^2 + K_2 - ((\eta_{MP}(I,N,T)IN)/(p_O - p_I)^2)))$$

The foregoing SOC equation can, thus, provide a value for the battery SOC utilizing pump measurements. In one embodiment, the memory 134 within the control system 130 includes a SOC lookup table 166 and/or a data driven SOC model 168. The data driven model 168 in some embodiments includes a set of curves fitted to experimental data for SOC of the system versus electrolyte density. The SOC rate lookup table 166 and/or data driven SOC model 168 are shown schematically in FIG. 3. Operating parameters which are used in conjunction with the lookup table 166 and/or a data driven model 168 include a differential pressure signal 190 from the differential pressure sensor 142/152, a current signal 192 from the current sensor 144/154, a speed signal 194 from the speed sensor 146/156, and a temperature signal 196 from the temperature sensor 140/150. In some embodiments, one or both of the differential pressure signals 190 for the pumps 104/114 are replaced with input and outlet pressure signals from the pumps 104/114.

Accordingly, the processor 132 in some embodiments determines a SOC of the flow battery system 100 using the same operating parameters that are used to determine the flow rates of the pumps 104/114.

In one embodiment, the mapping defined by the SOC equation, or by the SOC lookup table 166 or SOC model 168 is adapted online using data from charge or discharge cycles of the battery, when the actual state of charge can be determined through other measurements, such as voltage across the electrodes when the battery is completely full or completely empty. The updated motor and pump efficiency map $\rho_{MP}$ in some embodiments is also used to update the mapping in the equation of paragraph 22 and/or the flow lookup table 162 or flow model 164.

The above described embodiment includes two pumps and two electrolyte tanks. In other embodiments, more or fewer pumps and/or electrolyte tanks are used. By way of example, in one embodiment including the control system 130, a single feed pump is operably connected to a single electrolyte tank. In one such system configured as a Zinc Bromide flow battery, Zinc gets plated onto a negative electrode during battery operation and the released Bromine is complexed with an additive in the electrolyte resulting in a change in electrolyte concentration. Thus, the electrolyte concentration varies as the SOC varies in a manner like the embodiment of FIG. 1.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A flow battery system comprising:
   a reactor;
   a first pump operably connected to a first electrolyte tank and to the reactor;
   a second pump operably connected to a second electrolyte tank and to the reactor;
   a memory including program instructions stored therein; and
   a controller operably connected to the first pump, the second pump, and the memory and configured to execute the program instructions to
      determine a first flow rate through the first pump based upon first pump operating parameters including a differential pressure across the first pump,
      control the first pump based upon the first flow rate,
      determine a second flow rate through the second pump based upon second pump operating parameters including a differential pressure across the second pump,
      control the second pump based upon the second flow rate.

2. The flow battery system of claim 1, further comprising:
   a first current sensor configured to generate a first signal associated with an amount of current used by the first pump; and
   a second current sensor configured to generate a second signal associated with an amount of current used by the second pump, wherein:
   the first flow rate is based upon the first signal; and
   the second flow rate is based upon the second signal.

3. The flow battery system of claim 2, further comprising:
   a first speed sensor configured to generate a third signal associated with a speed of the first pump; and
   a second speed sensor configured to generate a fourth signal associated with a speed of the second pump, wherein:
   the first flow rate is based upon the third signal; and
   the second flow rate is based upon the fourth signal.

4. The flow battery system of claim 3, further comprising:
   a first temperature sensor configured to generate a fifth signal associated with a temperature of the first pump; and
   a second temperature sensor configured to generate a sixth signal associated with a temperature of the second pump, wherein:
   the first flow rate is based upon the fifth signal; and
   the second flow rate is based upon the sixth signal.

5. The flow battery system of claim 1, wherein the controller is further configured to execute the program instructions to:
   determine the first flow rate based upon a data driven flow rate model; and
   determine the second flow rate based upon the data driven flow rate model.

6. The flow battery system of claim 5, wherein the controller is further configured to execute the program instructions to:
   determine a state of charge (SOC) of the flow battery system based upon the first pump operating parameters, the differential pressure across the first pump, the second pump operating parameters, and the differential pressure across the second pump.

7. The flow battery system of claim 6, wherein the controller is further configured to execute the program instructions to:
   determine the SOC based upon a data driven SOC model.

8. The flow battery system of claim 1, wherein the controller is further configured to execute the program instructions to:
   determine the first flow rate based upon a flow rate look-up table; and
   determine the second flow rate based upon the flow rate look-up table.

9. The flow battery system of claim 8, wherein the controller is further configured to execute the program instructions to:
   determine a state of charge (SOC) of the flow battery system based upon the first pump operating parameters, the differential pressure across the first pump, the second pump operating parameters, and the differential pressure across the second pump.

10. The flow battery system of claim 9, wherein the controller is further configured to execute the program instructions to:
    determine the SOC based upon a SOC look-up table.

11. The flow battery system of claim 1, wherein the controller is further configured to execute the program instructions to:
    determine the first flow rate based upon a combined efficiency map associated with the first pump; and
    determine the second flow rate based upon a combined efficiency map associated with the second pump.

12. A flow battery system comprising:
    a reactor;
    at least one pump operably connected to at least one electrolyte tank and to the reactor;

a memory including program instructions stored therein; and a controller operably connected to the at least one pump, and the memory and configured to execute the program instructions to obtain first signals associated with operating parameters of the at least one pump, associate the first signals with a first flow rate through the at least one pump, and control the at least one pump based upon the associated first flow rate.

13. The flow battery system of claim 12, further comprising:

a first current sensor configured to generate a first current signal associated with an amount of current used by the at least one pump, wherein:

the first signals include the first current signal.

14. The flow battery system of claim 13, further comprising:

a first speed sensor configured to generate a first speed signal associated with a speed of the at least one pump, wherein:

the first signals include the first speed signal.

15. The flow battery system of claim 14, further comprising:

a first temperature sensor configured to generate a first temperature signal associated with a temperature of the at least one pump, wherein:

the first signals include the first temperature signal.

16. The flow battery system of claim 12, wherein the controller is further configured to execute the program instructions to:

associate the first flow rate using a data driven flow rate model.

17. The flow battery system of claim 16, wherein the controller is further configured to execute the program instructions to:

determine a state of charge (SOC) of the flow battery system based upon the first signals.

18. The flow battery system of claim 17, wherein the controller is further configured to execute the program instructions to:

determine the SOC based upon a data driven SOC model.

19. The flow battery system of claim 12, wherein the controller is further configured to execute the program instructions to:

associate the first flow rate using a look-up flow rate table.

20. The flow battery system of claim 19, wherein the controller is further configured to execute the program instructions to:

determine a state of charge (SOC) of the flow battery system based upon first signals.

* * * * *